US010257960B1

(12) United States Patent
Banerjee et al.

(10) Patent No.: US 10,257,960 B1
(45) Date of Patent: Apr. 9, 2019

(54) POWER DISTRIBUTION FOR IMMERSION-COOLED INFORMATION SYSTEMS

(71) Applicant: TAS Energy, Inc., Houston, TX (US)

(72) Inventors: Abhishek Banerjee, Houston, TX (US); Jon Benson, Houston, TX (US)

( * ) Notice: Subject to any disclaimer, the term of this patent is extended or adjusted under 35 U.S.C. 154(b) by 0 days.

(21) Appl. No.: 16/117,870

(22) Filed: Aug. 30, 2018

Related U.S. Application Data

(63) Continuation-in-part of application No. 16/042,306, filed on Jul. 23, 2018.

(51) Int. Cl.
| | |
|---|---|
| *H01B 7/00* | (2006.01) |
| *H05K 7/20* | (2006.01) |
| *H05K 7/14* | (2006.01) |
| *H01R 25/16* | (2006.01) |
| *H02B 1/56* | (2006.01) |
| *H01R 12/72* | (2011.01) |
| *H02B 1/20* | (2006.01) |

(52) U.S. Cl.
CPC ........... *H05K 7/203* (2013.01); *H01B 7/0045* (2013.01); *H01R 12/722* (2013.01); *H01R 25/162* (2013.01); *H02B 1/20* (2013.01); *H02B 1/56* (2013.01); *H05K 7/1427* (2013.01); *H05K 7/20327* (2013.01)

(58) Field of Classification Search
CPC ........... H05K 7/20236; H05K 7/20318; H05K 7/20327; H05K 7/1427; H05K 7/1449; H05K 3/429; G06F 1/20; H01B 7/0045; H01R 12/722; H02B 1/202
USPC ................ 361/601, 730, 728, 826, 827, 792
See application file for complete search history.

(56) References Cited

U.S. PATENT DOCUMENTS

| | | | | |
|---|---|---|---|---|
| 3,129,991 | A | * | 4/1964 | Schmitz ................ H01R 12/73 439/64 |
| 3,728,585 | A | | 4/1973 | Olashaw |
| 3,999,105 | A | | 12/1976 | Archey et al. |
| 4,487,466 | A | * | 12/1984 | Petit ...................... H01R 29/00 439/222 |
| 4,679,123 | A | * | 7/1987 | Young .................... H02B 1/202 174/72 A |
| 5,297,621 | A | | 3/1994 | Taraci et al. |
| 6,019,167 | A | | 2/2000 | Bishop et al. |
| 8,014,150 | B2 | | 9/2011 | Campbell et al. |

(Continued)

OTHER PUBLICATIONS

Phillip E. Tuma, "Design Considerations Relating to Non-Thermal Aspects of Passive 2-Phase Immersion Cooling", 27th IEEE Semi-Therm Symposium (2011), 9 pages.
3M Novec 649 Engineered Fluid, 3M Electronics Markets Materials Division (Sep. 2009), 4 pages.
3M Novec Engineered Fluids—Two-Phase Immersion Cooling, 3M Electronics Materials Solutions Division (2015), 4 pages.

(Continued)

*Primary Examiner* — Steven T Sawyer
(74) *Attorney, Agent, or Firm* — Jonathan M. Pierce; Porter Hedges LLP

(57) ABSTRACT

A two-phase immersion cooling system includes two or more voltage converters and a plurality of circuit boards, which are held in a modular case inside an immersion tank. A layout for distributing electric power includes at least two busbars that are electrically connected in parallel to the positive and the negative terminals of the voltage converters, respectively. Each of the plurality of circuit boards is connected to the two busbars via wires that are bundled into wire harnesses. Each wire harness connects a series of connectors longitudinally aligned across the plurality of boards, to the two busbars.

21 Claims, 15 Drawing Sheets

(56) References Cited

U.S. PATENT DOCUMENTS

| | | | |
|---|---|---|---|
| 9,713,290 | B2 | 7/2017 | James et al. |
| 9,921,622 | B2 | 3/2018 | Shelnutt et al. |
| 2004/0223311 | A1* | 11/2004 | Lee .................. H05K 7/1425 |
| | | | 361/826 |
| 2005/0076479 | A1* | 4/2005 | Rolla ................ H05K 7/1449 |
| | | | 24/302 |
| 2006/0090881 | A1 | 5/2006 | Tuma |
| 2008/0180917 | A1* | 7/2008 | Lawrence ........... H05K 7/1454 |
| | | | 361/724 |
| 2008/0196868 | A1 | 8/2008 | Attlesey et al. |
| 2010/0302715 | A1 | 12/2010 | Bortoli et al. |
| 2015/0047372 | A1 | 2/2015 | Kaufmann et al. |
| 2015/0060009 | A1 | 3/2015 | Shelnutt et al. |
| 2017/0117103 | A1 | 4/2017 | Kennelly |

OTHER PUBLICATIONS

3M Thermal Management Fluids, 3M Electronics Markets Materials Division (Sep. 2009), 8 pages.

Phil E. Tuma, "Passive 2-Phase Immersion Cooling (P2PIC) of Bitcoin Hardware and Implications for other Computing Applications", 3M Market Solutions Division, Presentation at iMAPs ATW (2015), 18 pages.

3M Two-Phase Immersion Cooling—High Level Best Practices for System Fabrication*, Technical Paper, (2014), 4 pages.

2-Phase Immersion Cooling (2PIC) With High Performance Heat Transfer, Wieland Thermal Solutions; URL: http:// www.wieland-thermalsolutions.com/internet/en/applications/refrigeration_technology/immersion_cooling/t03_inhaltsseite_21.jsp.

* cited by examiner

POWER DISTRIBUTION FOR IMMERSION-COOLED INFORMATION SYSTEMS

CROSS-REFERENCE TO RELATED APPLICATIONS

This application is a Continuation-in-part of U.S. application Ser. No. 16/042,306 filed on Jul. 23, 2018, which is incorporated herein by reference.

BACKGROUND

This disclosure generally relates to methods and apparatus for cooling electric or electronic components using one or more dielectric heat transfer fluids and, more specifically, to methods and apparatus for distributing electrical power into an immersion tank.

Conventional electronic components are designed to operate over a specified temperature range with upper limits generally below 70 deg. C. for commercial grade, 85 deg. C. for industrial grade, or 125 deg. C. for military grade; therefore, these components may require cooling such that their internal temperature remains below these upper limits. The cooling can be performed, among other ways, by the vaporization of a dielectric heat transfer fluid, such as perfluorocarbons, fluoroketones, or hydrofluoroethers. Depending on its composition, the dielectric heat transfer fluid may have a boiling temperature at atmospheric pressure that may range from approximately 35 deg. C. to approximately 100 deg. C., such that the boiling temperature at atmospheric pressure is lower than the upper limits at which conventional electronic components are designed to operate. The electronic components are immersed in the dielectric heat transfer fluid in liquid phase. When the surfaces of electronic components in contact with the dielectric heat transfer fluid reach the boiling temperature of the dielectric heat transfer fluid, the dielectric heat transfer fluid located nearby will vaporize, therefore absorbing heat from the electronic components.

Known two-phase cooling systems are described in U.S. Pat. Appl. Pub. No. 2014/0218858. In such a system, power distribution units may be located inside immersion cooling tanks, and below a surface level of the dielectric fluid in the liquid phase. Each of the power distribution units can provide electrical power to the various electronic devices and/or components within the immersion cooling tanks via power cables extending from the power distribution unit to a single connector provided on a single server rack, and each rack may contain multiple servers.

Usually, a single harness connects each board of a server to a power source. For example, a single harness would basically connect all of the connectors of a single board to a power source, which usually includes a single voltage converter. However, in configurations where a single harness connects all of the connectors of a single board to a power source, the harness configuration may become bulky and may prevent suitable circulation of the dielectric heat transfer fluid (in vapor phase or liquid phase) in the immersion cooling tanks.

Thus, there is a continuing need in the art for improved two-phase immersion cooling systems and methods, where the harness configuration preferably reduces the number of harnesses for a given number of boards, is preferably compact to facilitate a sufficient circulation of the of dielectric heat transfer fluid, and optionally draws current from voltage converters assembled in parallel.

BRIEF SUMMARY OF THE DISCLOSURE

The disclosure describes electric power distribution in a two-phase immersion cooling system. The two-phase immersion cooling system may comprise a skid. An immersion tank and a plurality of voltage converters may be mounted on the skid. The plurality of voltage converters may preferably be mounted outside the immersion tank. The immersion tank may include a container for holding a bath of dielectric heat transfer fluid in liquid phase and at least one condenser for condensing dielectric heat transfer fluid from a vapor phase to a liquid phase. A modular case, which may be configured for holding a plurality of circuit boards, may be at least partially lowered into the container.

The electric power distribution may be accomplished using at least two busbars. Each busbar may extend through a wall of the immersion tank, and thus may include an inner portion extending inside the immersion tank and an outer portion extending outside the immersion tank. A first one of the at least two busbars may be electrically connected in parallel to a positive terminal of each of the plurality of voltage converters. A second one of the at least two busbars may be electrically connected in parallel to a negative terminal of each of the plurality of voltage converters. Each of the plurality of circuit boards may be connected to the at least two busbars via connector plates that are secured to the modular case, and wire harnesses.

In some embodiments, the wire harnesses comprise wires bundled together via fastening ties. Each wire may have a horizontal portion that extends longitudinally along a portion of a lattice attached to the modular case, and a vertical portion. The vertical portions of the wires forming a single wire harness may be regularly spaced along the longitudinal direction of the modular case. The wires forming the single wire harness may connect a series of connectors longitudinally aligned across the plurality of boards to the two busbars. For example, a connector to one of a plurality of circuit boards may be provided at the lower end of the vertical portions of the wires. A pin or spade configured to be attached to one of the connector plates via a socket or lug may be provided at the other end of the wires forming the single wire harness.

In some embodiments, additional fastening ties may be used to attach the wire harnesses to lateral sides of the modular case.

BRIEF DESCRIPTION OF THE DRAWINGS

For a more detailed description of the embodiments of the disclosure, reference will now be made to the accompanying drawings, wherein.

DETAILED DESCRIPTION

Figure 1:
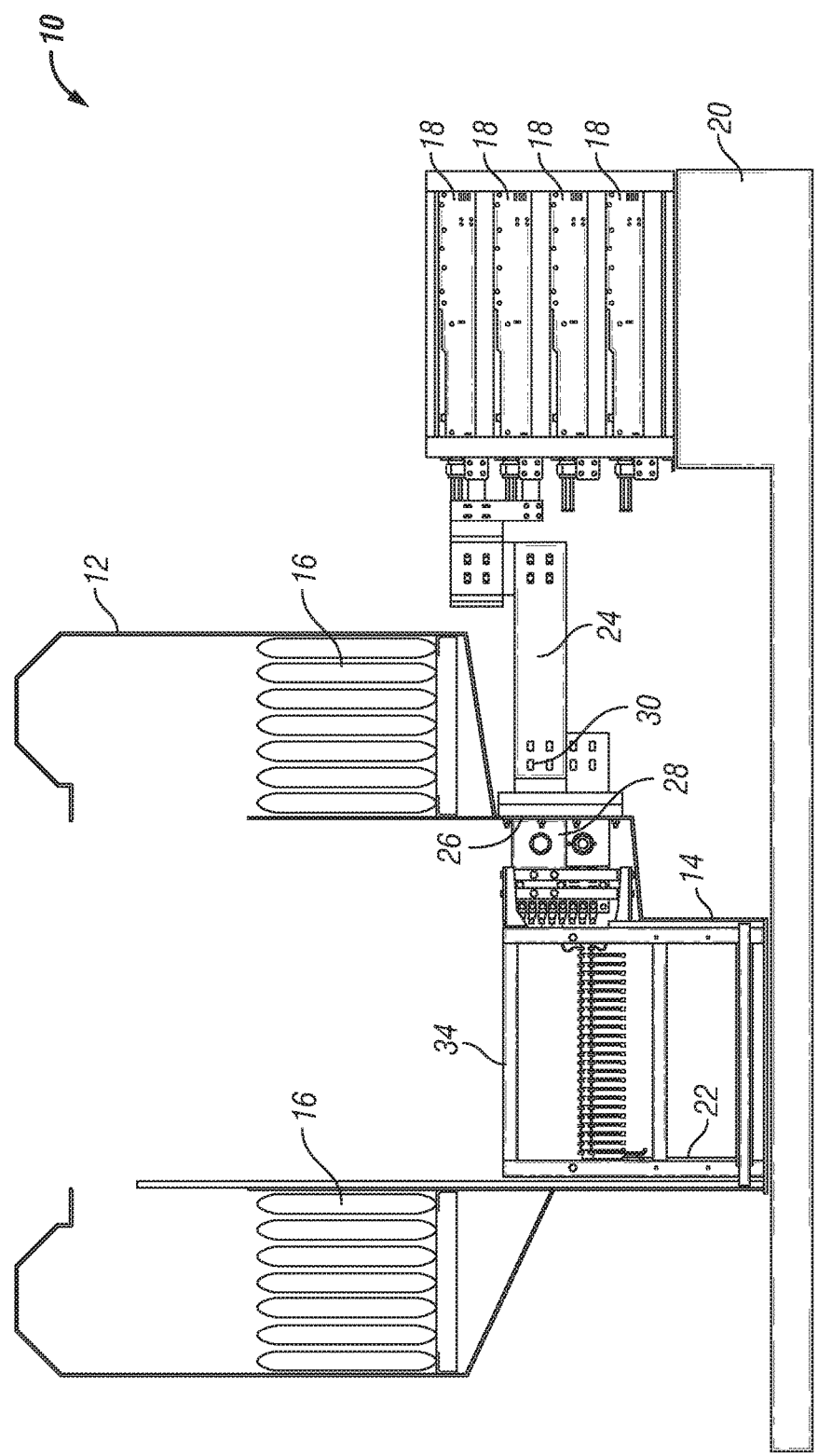
FIG. 1 is a sectional view of a system for two-phase immersion cooling illustrating an immersion tank, voltage converters mounted outside the immersion tank, and a plurality of busbars connected to voltage converters and to circuit boards.

It is to be understood that the following disclosure describes several exemplary embodiments for implementing different features, structures, or functions of the invention. Exemplary embodiments of components, arrangements, and configurations are described below to simplify the disclosure; however, these exemplary embodiments are provided merely as examples and are not intended to limit the scope of the invention. Additionally, the disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Finally, the exemplary embodiments presented below may be combined in any combination of ways, i.e., any element from one exemplary embodiment may be used in any other exemplary embodiment, without departing from the scope of the disclosure.

All numerical values in this disclosure may be exact or approximate values unless otherwise specifically stated. Accordingly, various embodiments of the disclosure may deviate from the numbers, values, and ranges disclosed herein without departing from the intended scope. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

In the following discussion and in the claims, the terms "including" and "comprising" are used in an open-ended fashion, and thus should be interpreted to mean "including, but not limited to." Furthermore, as it is used in the claims or specification, the term "or" is intended to encompass both exclusive and inclusive cases, i.e., "A or B" is intended to be synonymous with "at least one of A and B," unless otherwise expressly specified herein.

Certain terms are throughout the following description and claims refer to particular components. As one having ordinary skill in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function.

FIG. 1 illustrates a system 10 for two-phase immersion cooling. Accordingly, the system 10 comprises an immersion tank 12. The immersion tank 12 includes a container 14 for holding a bath of dielectric heat transfer fluid in liquid phase, and at least one condenser 16 for condensing dielectric heat transfer fluid from a vapor phase to a liquid phase. The container 14 may form a portion of the immersion tank 12. The two-phase immersion cooling system 10 also comprises a plurality of circuit boards 22 (only one is shown in FIG. 1). For example, the circuit boards 22 can be programmed for blockchain mining operation. The circuit boards 22 are sized to be lowered into the container 14, preferably so that the circuit boards 22 can be entirely immersed into the bath of dielectric heat transfer fluid in liquid phase. For example, the circuit boards 22 can be held in modular cases 34, and the modular cases 34 can be at least partially lowered into the container 14, while an upper portion of the modular cases 34 may emerge from the bath of dielectric heat transfer fluid in liquid phase. Non-limiting examples of immersion tanks that may be used are described in U.S. patent application Ser. No. 15/983,739, filed on May 18, 2018, and Ser. No. 16/019,252, filed on Jun. 26, 2018, which are included herein by reference.

The system 10 comprises a plurality of voltage converters 18 mounted on a skid 20, on which the immersion tank 12 can also be mounted. For example, the voltage converters 18 may be placed in shelves. The voltage converters 18 are designed for converting a high voltage (e.g., 415 volts, 3-phases, Alternating Current), low amperage current into a low voltage (e.g., 12 volts, Direct Current), high amperage current. In order to reduce the volume of the bath of dielectric heat transfer fluid in liquid phase, the voltage converters 18 are preferably mounted outside the immersion tank 12.

In order to pass the high amperage current from the voltage converters 18 to the circuit boards 22, the system 10 comprises a plurality of busbars 24 (only one complete busbar 24 is shown in FIG. 1). The busbars 24 extend through a wall 26 of the immersion tank 12. For example, the busbars 24 include an inner portion 28 extending inside the immersion tank 12, and an outer portion 30 extending outside the immersion tank 12. Each busbar 24 is electrically connected to at least one, and preferably more than one, voltage converters 18. Each busbar 24 is also electrically connected to at least one, and preferably several, circuit boards 22. The busbars 24 can be made essentially of copper. Aluminum, or a combination of copper and aluminum may be used instead of copper. The busbars 24 can be at least partially plated. For example, a portion of each busbar 24 that is located outside of the immersion tank 12 can be plated with silver to avoid corrosion of the portion. Other noble metals or alloys can be used for plating.

Figure 2:
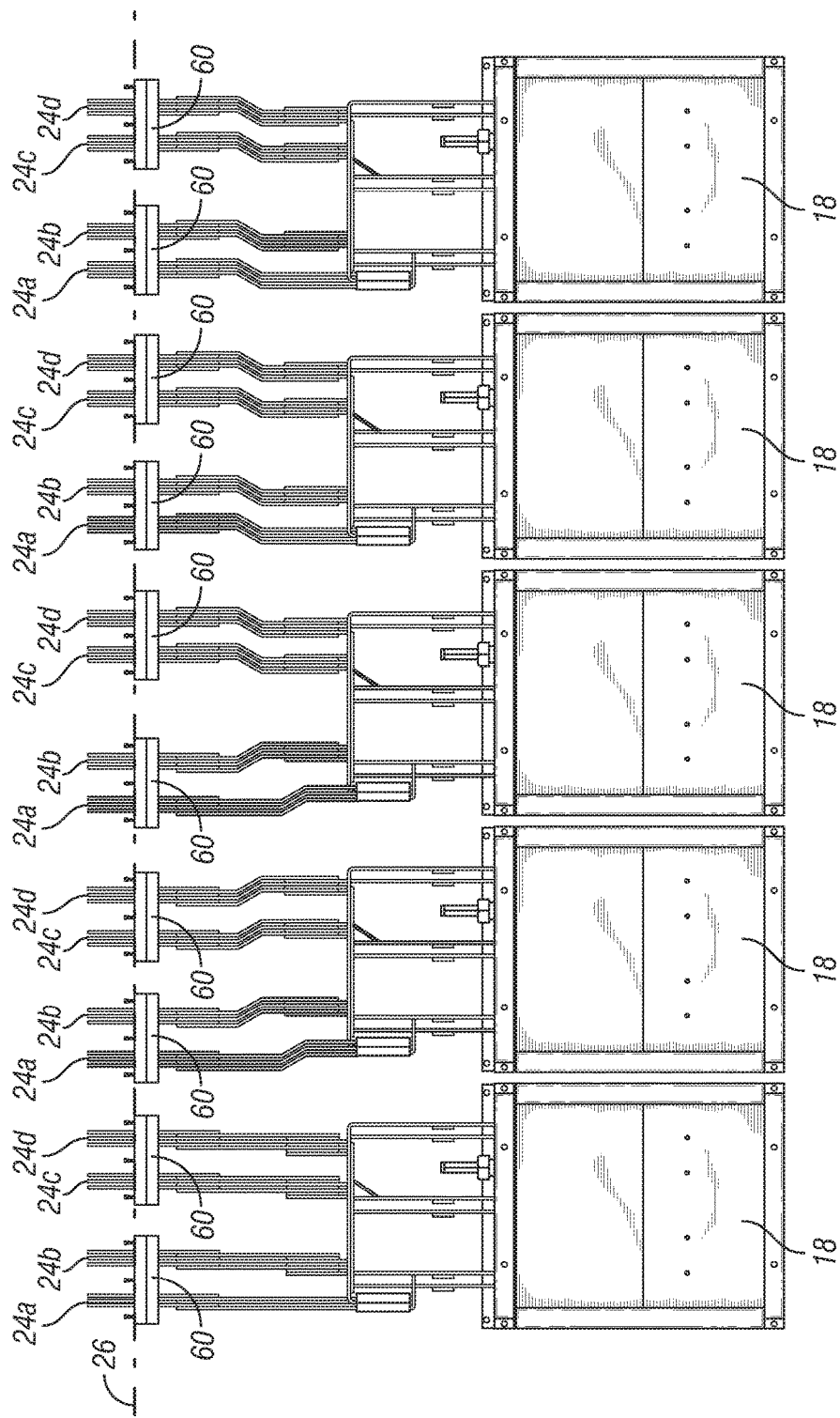
FIG. 2 is a top view of a portion of the system shown in FIG. 1 illustrating the voltage converters and the plurality of busbars connected to the voltage converters.

FIG. 2 illustrates the example configuration of the busbars 24 and the voltage converters 18 shown in FIG. 1, wherein, for the sake of clarity, FIG. 2 does not show the immersion tank 12, but the wall 26 is shown in ghost line. In the embodiment shown in FIG. 2, 40 voltage converters 18 are placed in shelves having 4 rows and 5 columns, each of which may provide 25 kilowatts of electric power. The voltage converters 18 have 3 pairs of terminals, each pair having a positive terminal and a negative (or ground) terminal. In each column, the 3 positive terminals of the top voltage converter 18 and the 3 positive terminals of the voltage converter 18 located immediately below the top voltage converter 18 are connected in parallel to a single busbar (one of the busbars 24*a*). The 3 negative terminals of the top voltage converter 18 and the 3 negative terminals of the voltage converter 18 located immediately below the top voltage converter 18 are also connected in parallel to a single busbar (one of the busbars 24*b*). Similarly, the 3 positive terminals of the bottom voltage converter 18 and the 3 positive terminals of the voltage converter 18 located immediately above the bottom voltage converter 18 are connected in parallel to a single busbar (one of the busbars 24*c*). The 3 negative terminals of the bottom voltage converter 18 and the 3 negative terminals of the voltage converter 18 located immediately above the bottom voltage converter 18 are also connected in parallel to a single busbar (one of the busbars 24*d*). Other configurations of the busbars 24 and the voltage converters 18 are also possible, as can be appreciated by as a person of ordinary skill in the art who has been given the benefit of the disclosure.

Figure 3:
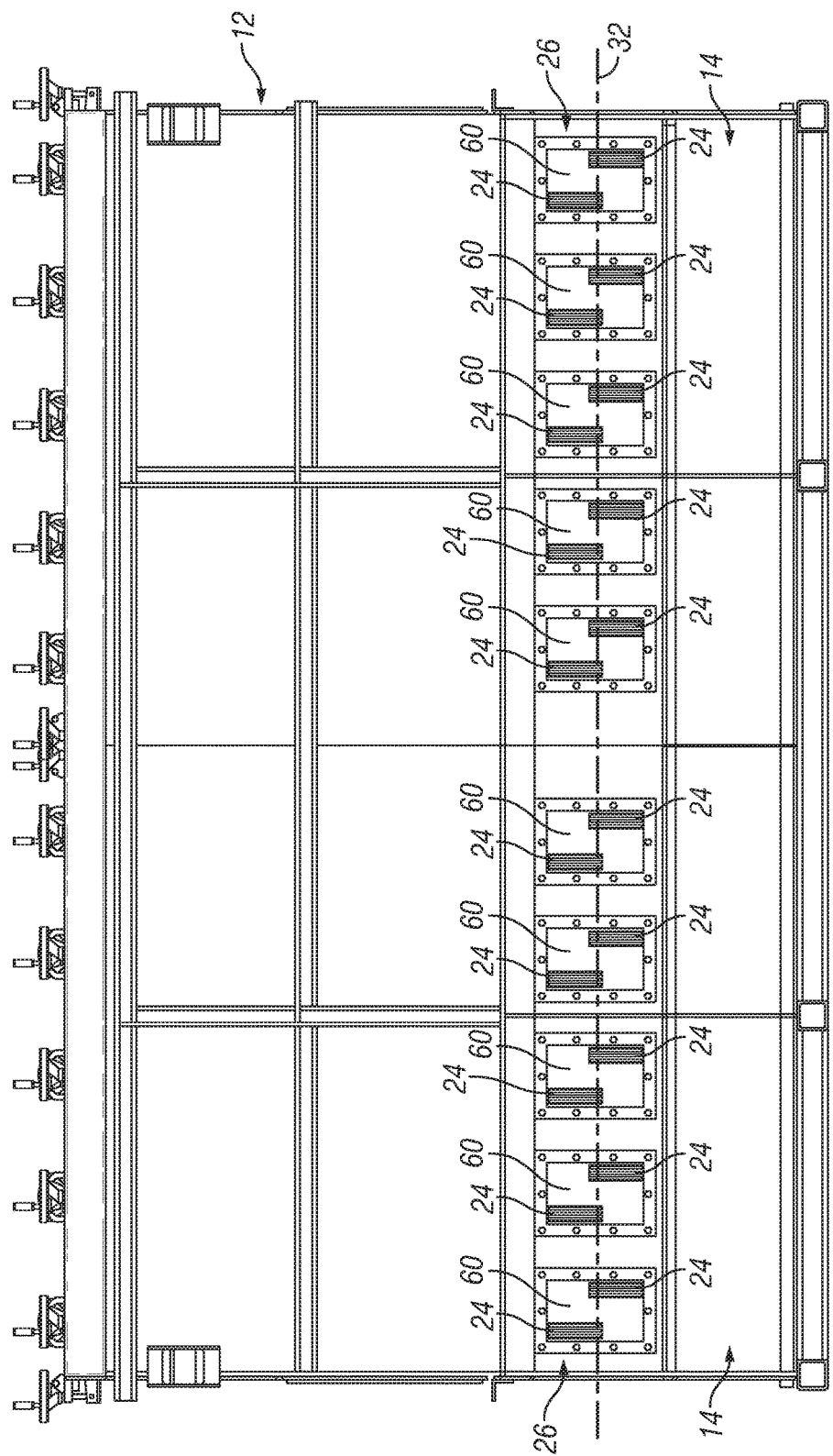
FIG. 3 is a side view of a portion of the system shown in FIG. 1 illustrating the immersion tank and the plurality of busbars extending through a wall of the immersion tank.

FIG. 3 further illustrates the example configuration of the busbars 24 and the immersion tank 12 shown in FIG. 1, wherein, for the sake of clarity, FIG. 3 does not show the voltage converters 18. The busbars 24 are preferably distributed over a horizontal direction 32 of the wall 26 of the immersion tank 12. In other words, the busbars 24 preferably span a substantial portion of the wall 26 along the horizontal direction 32. Further, the busbars 24 are optionally, but not necessarily, located alternately at approximately equal distances above and below the horizontal direction 32. Still further, sets of busbars 24 located above the horizontal direction 32 are optionally, but not necessarily, approximately evenly spaced over the horizontal direction 32 of the wall 26. Similarly, sets of busbars 24 located below the horizontal direction 32 are optionally, but not necessarily, approximately evenly spaced over the horizontal direction 32 of the wall 26.

Figure 4:
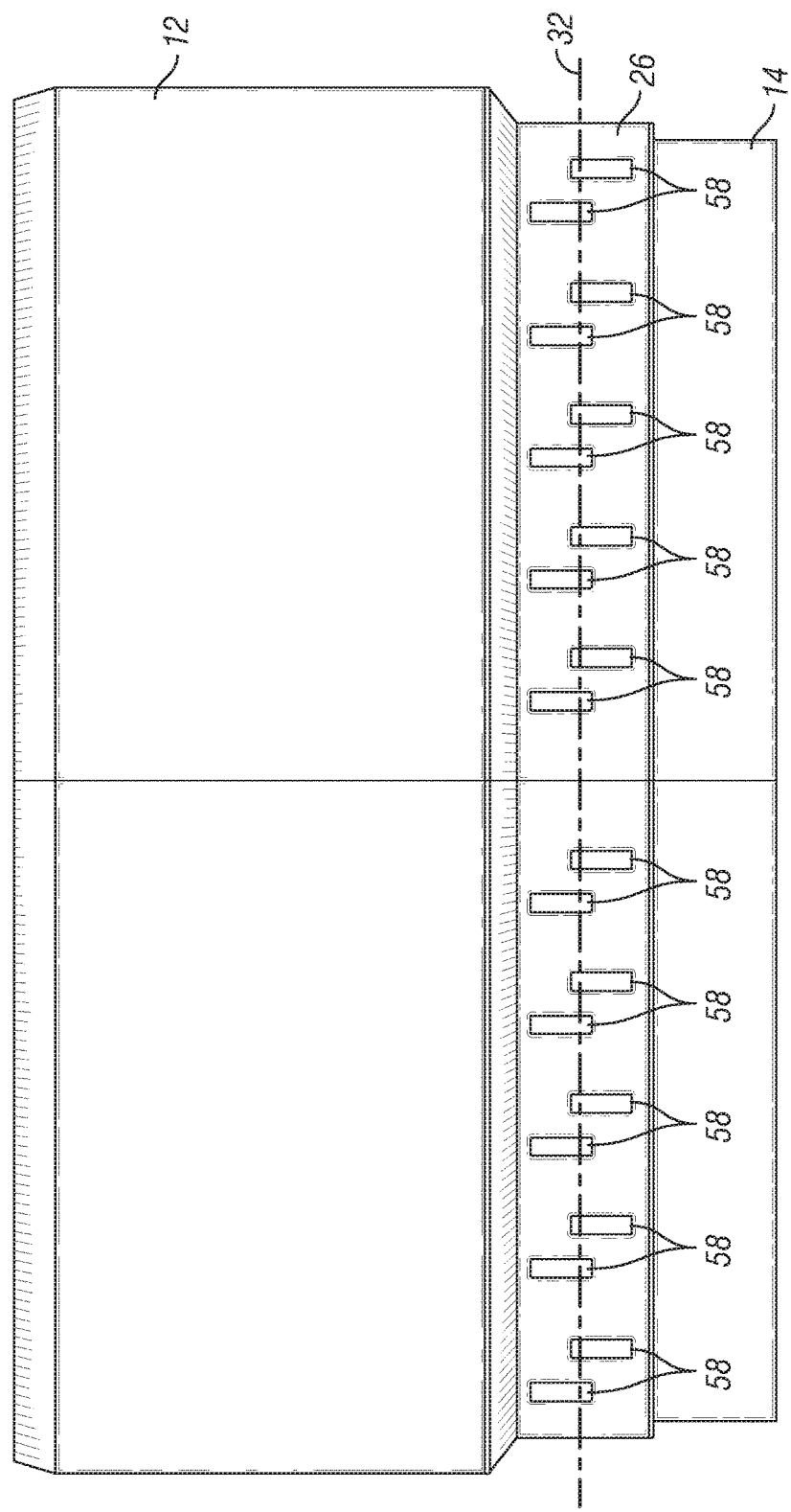
FIG. 4 is a side view of a portion of the system shown in FIG. 1 illustrating only the immersion tank traversed by apertures.

FIG. 4 illustrates the side of the immersion tank 12 shown in FIG. 1. In order to allow for the busbars 24 to extend through the wall 26 of the immersion tank 12, one or more apertures 58 traverse the wall 26. Between 10 and 20 apertures 58 may traverse through the wall 26 of the immersion tank 12 (the embodiment shown in FIG. 4 comprises 20 apertures 58).

Referring to FIGS. 2, 3 and 4, the busbars 24 (not shown in FIG. 4) extend through one of the apertures 58. The busbars 24 extending through one aperture can be designed to carry between 1,000 and 4,200 Amperes, and preferably between 2,100 and 4,200 Amperes. The system 10 further comprises a means for preventing leakage of dielectric fluid around the busbars 24, such as one or more sealing lids 60 (not shown in FIG. 4). The sealing lids 60 cover at least one of the apertures 58 (the sealing lids 60 shown in FIG. 3 cover two apertures 58). The busbars 24 extend through the sealing lids 60.

Figure 5A:
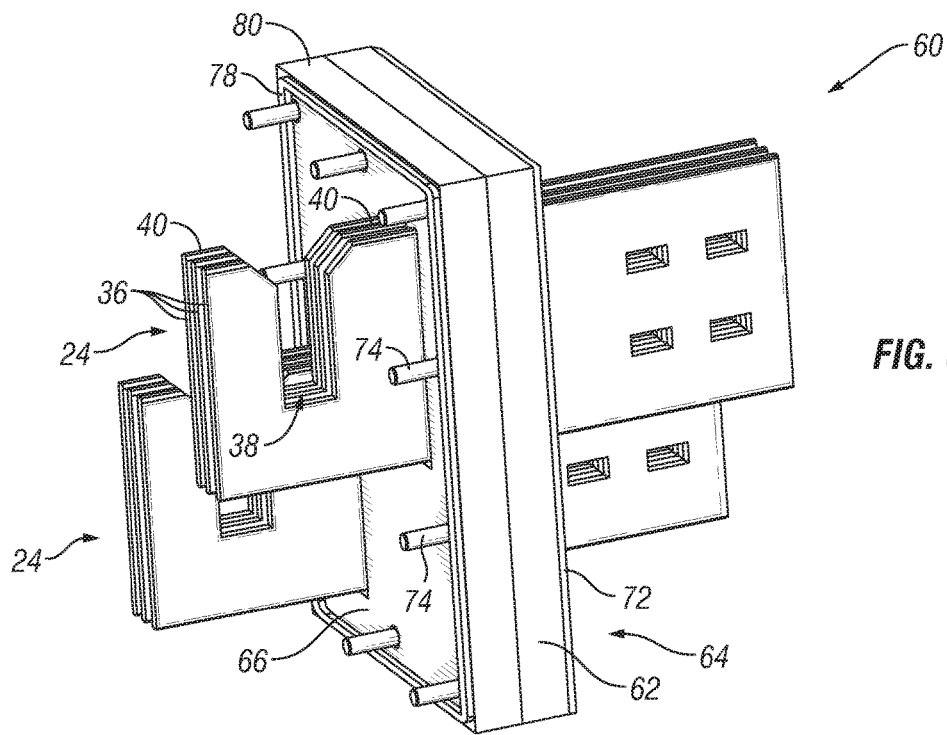
FIG. 5A is a perspective view illustrating a sealing lid for preventing leakage of dielectric fluid around the busbars.
Figure 5B:
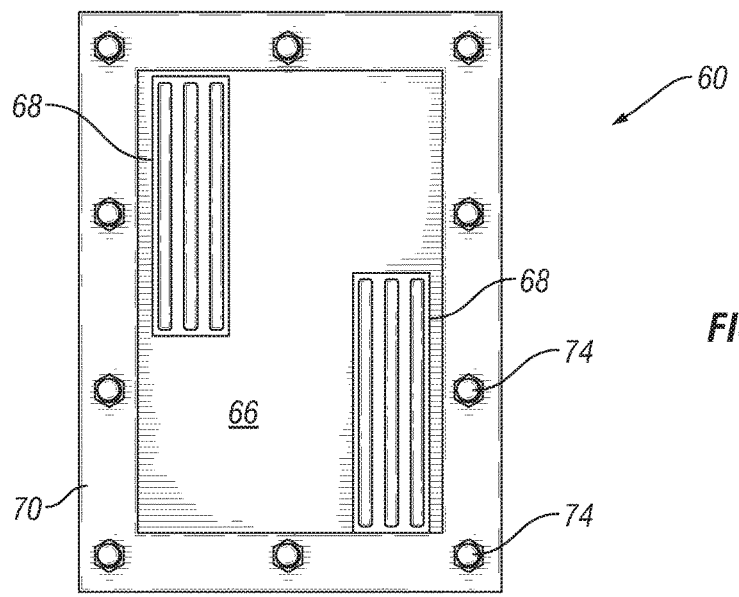
FIG. 5B is a side view of the sealing lid shown in FIG. 5A.

Referring to FIGS. 5A and 5B, the sealing lids 60 comprise a body 62, for example, made of fiberglass reinforced plastic. The body 62 has a first face 64 and a second face 66, which may be essentially parallel to the first face 64. The body 62 includes one or more body apertures 68 (the sealing lids 60 shown in FIGS. 2, 3, 5A, and 5B include two body apertures 68). The busbars 24 extend through the body apertures 68. The body apertures 68 may be potted with a resin-based polymer. The sealing lids 60 comprise a frame 70, for example, made of metal. The frame 70 is disposed along a first boundary 72 of the first face 64 of the body 62. The sealing lids 60 comprise a plurality of bolts 74. The bolts 74 are located in holes 76 (shown in ghost lines) traversing the body 62 and the frame 70. The holes 76 may be potted with a resin-based polymer. The sealing lids 60 comprise a sealing gasket 78. The sealing gasket 78 is disposed along a second boundary 80 of the second face 66. The sealing gasket 78 further surrounds the bolts 74 and the body apertures 68.

Figure 6:
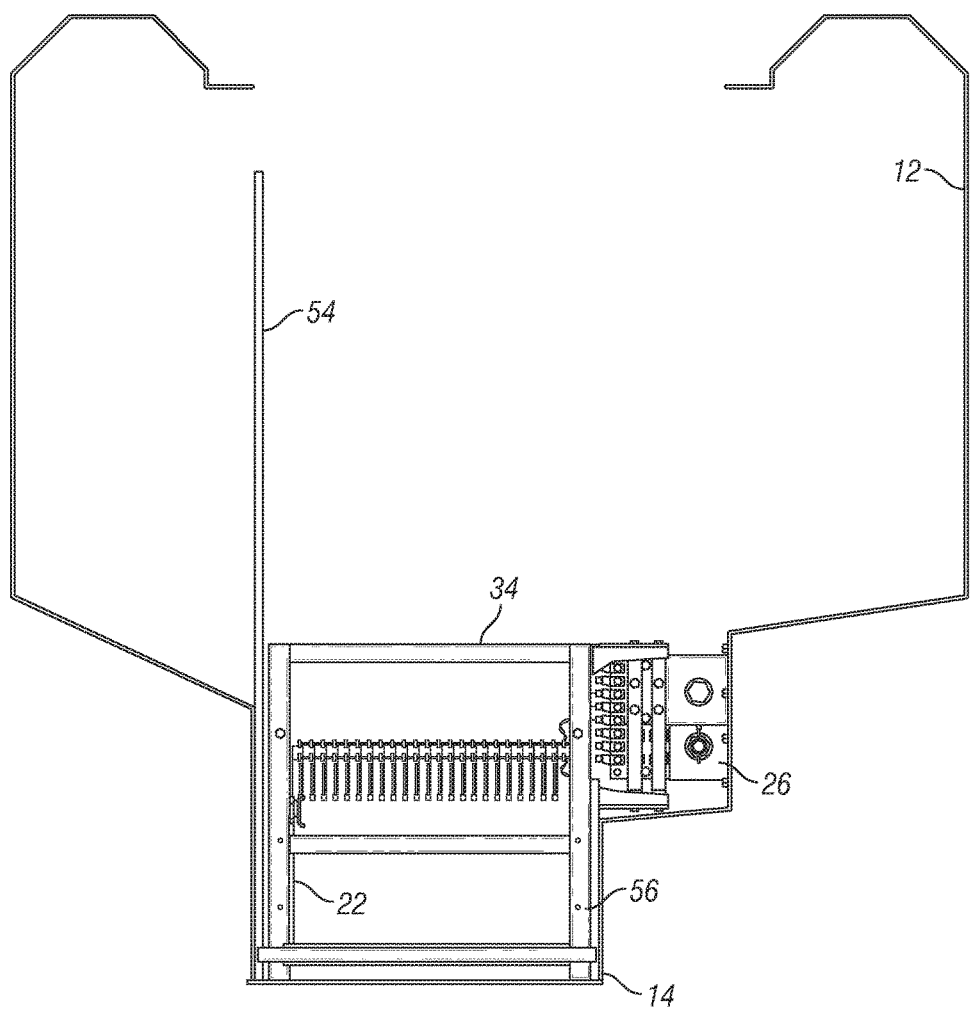
FIG. 6 is a schematic view of a portion of the system shown in FIG. 1 illustrating modular cases holding circuit boards at least partially lowered a bath of dielectric heat transfer fluid in liquid phase.

FIG. 6 illustrates an example configuration of modular cases 34 disposed in the immersion tank 12, wherein, for the sake of clarity, FIG. 6 does not show the busbars 24 and the voltage converters 18. In order to easily access the circuit boards 22 (only one circuit board is illustrated in FIG. 6), for example during installation or maintenance operation, the system 10 comprises modular cases 34 holding the circuit boards 22. The modular cases 34 are sized to be at least partially lowered into the container 14, which, in use, may be filled with a dielectric fluid in liquid phase. For example, a set of vertical rails 54, 56, secured to the immersion tank 12, can allow suitable guidance and alignment of the modular cases 34 with the inner portions 28 of the busbars 24 (shown in FIG. 1).

Figure 7A:
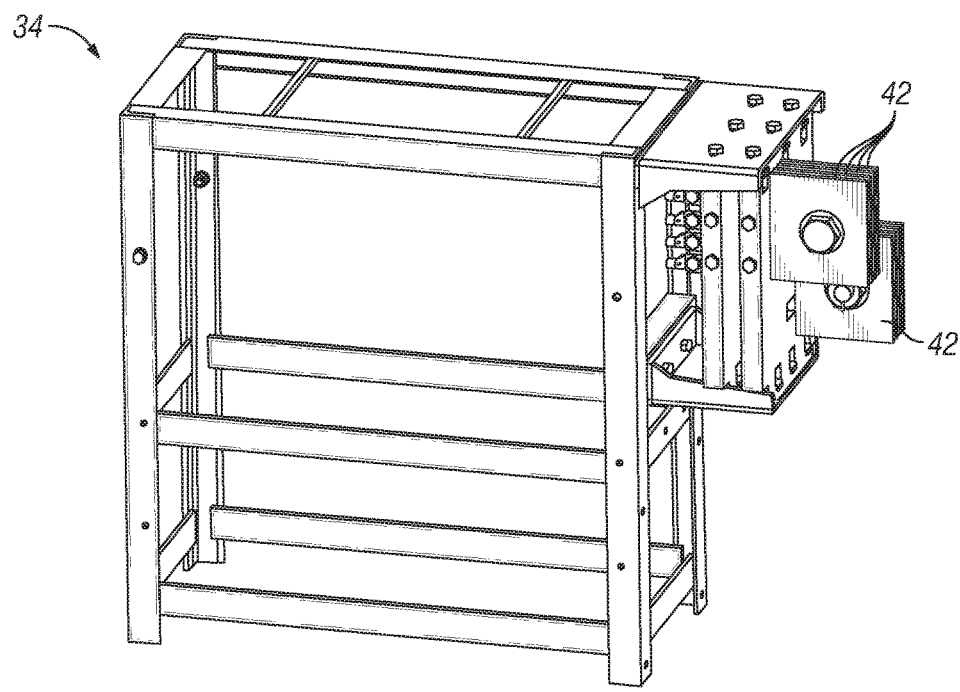
FIG. 7A is a perspective view of a modular case shown in FIG. 6 illustrating connections plates for establishing an electrical connection upon insertion of the modular case into the immersion tank.
Figure 7B:
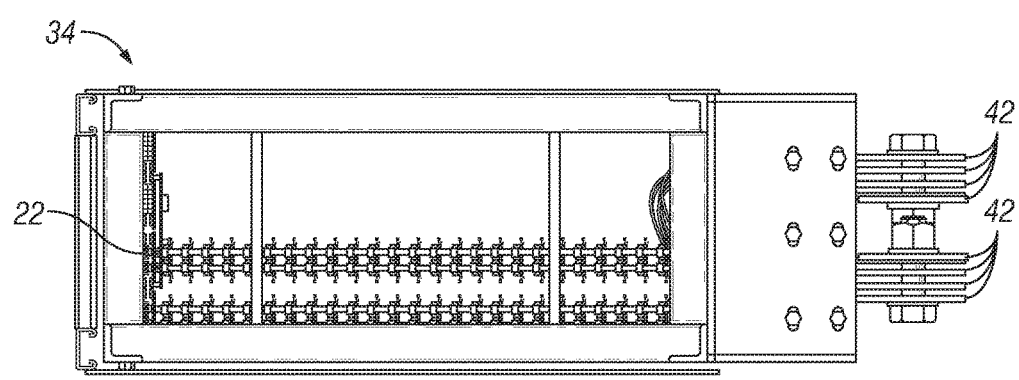
FIG. 7B is a top view of the modular case shown in FIG. 7A.

Referring to FIGS. 7A and 7B, the system 10 comprises means for connecting the busbars 24 to connector plates 42 secured to the modular cases 34. Two or more connector plates 42 are secured to the modular cases 34. The connector plates 42 may be spaced such that each busbar 24 plate is capable of sliding between two connector plates 42. As such, the modular cases 34 can be vertically inserted in the immersion tank 12, and electrical connections between the circuit boards 22 held in the modular cases 34 and the busbars 24 (shown in FIG. 1) extending through the wall 26 of the immersion tank 12 can be established. The circuit boards 22 (only shown in FIG. 7B) can thus be powered by the voltage converters 18 (shown in FIG. 1) via the busbars 24.

Referring back to FIG. 5A, the inner portion 28 of the busbars 24 comprises one or more busbar plates 36 (3 busbar plates 36 form one busbar 24 in the example of FIG. 5A). The busbar plates 36 have a notch 38 extending downward from an upper outer surface 40 of the busbar plates 36.

Figure 8A:
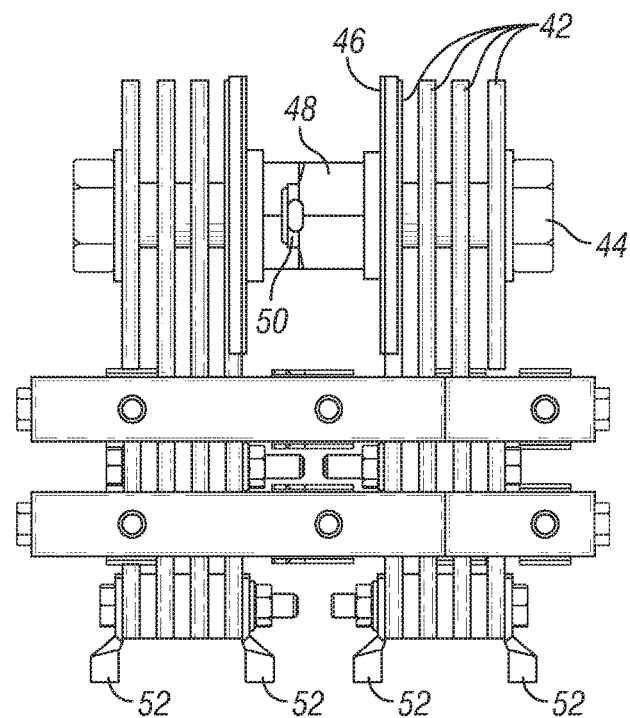
FIGS. 8A, 8B, and 8C are a top view, a side view, and a perspective view of an assembly traversing the connections plates shown in FIGS. 7A and 7B for connecting the busbars to the connectors plates.
Figure 8B:
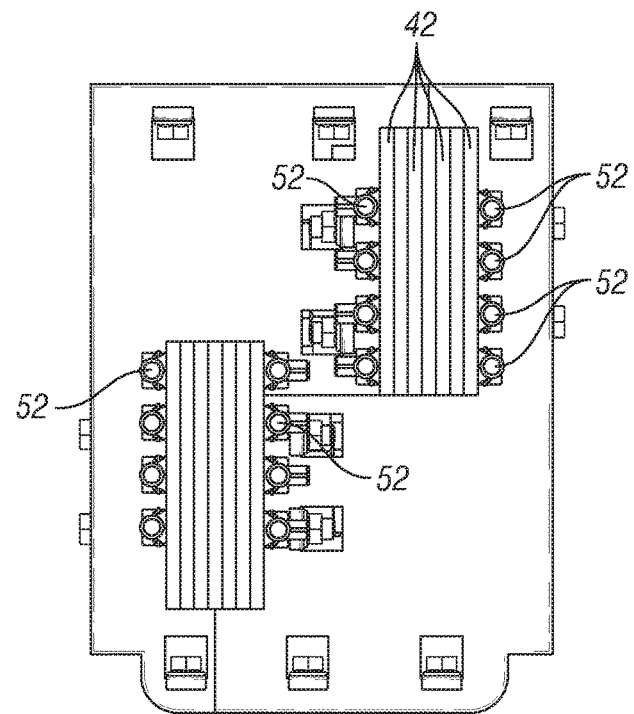
Figure 8C:
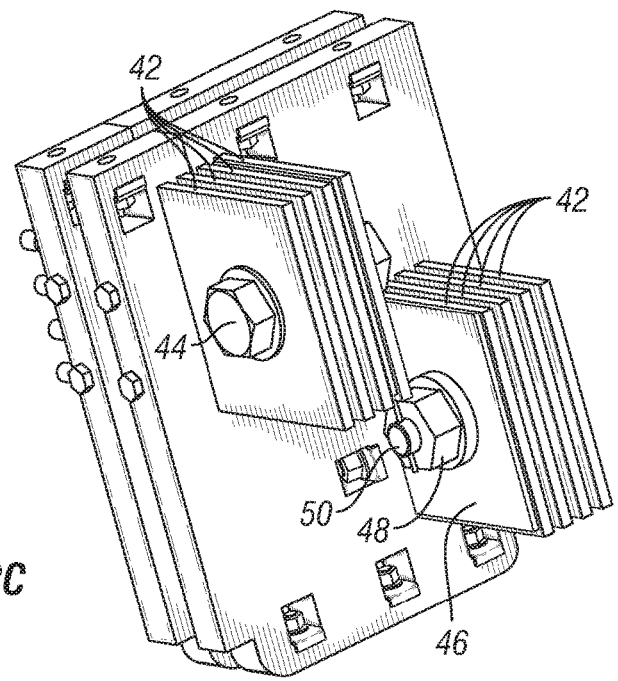

Turning to FIGS. 8A, 8B, and 8C, an assembly for connecting the busbars 24 (shown in FIG. 5A) to the connector plates 42 is illustrated, wherein, for the sake of clarity, FIGS. 8A, 8B, and 8C do not show the modular cases 34. A bolt 44 traverses the connector plates 42. The bolt 44 is sized to slide into the notches 38 of the busbar plates 36. An optional load distribution plate 46 is traversed by the bolt 44. A nut 48 can be threaded on an end portion 50 of the bolt 44. A plurality of sockets 52 (or lugs) are electrically connected to the connector plates 42. The sockets 52 are then connected to the circuit boards 22 via wire harnesses. Upon tightening the nut 48 by approximately ¼ of a turn, electrical contact can be established between the connector plates 42 and the busbar plates 36.

Conversely, the bolt may be held by the busbar plates and may slide into notches provided in the connection. Accordingly, the inner portion may comprise two or more busbar plates. A bolt may traverse the busbar plates. A load distribution plate may be traversed by the bolt. A nut may be threaded on an end portion of the bolt. One or more connector plates may be secured to the modular cases. The connector plates may be sized such that each connector plate is capable of sliding between two busbar plates. The connector plates may have a notch extending upward from a lower outer surface of the connector plates. The bolt may be sized to slide into the notches of the connector plates. Again, a plurality of sockets may be electrically connected to the connector plates.

Figure 9:
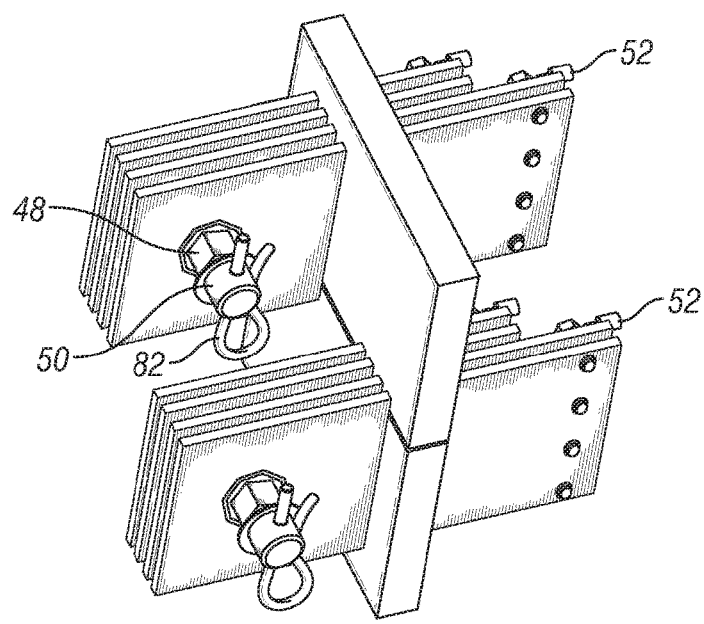
FIG. 9 is a perspective view of an assembly for connecting the busbars to the connectors plates.

In the alternative of assembly for connecting the busbars 24 shown in FIG. 9, a retention pin 82 is optionally provided at the end portion 50 of the bolt 44, to avoid dropping of the nut 48.

The disclosure further describes a configuration for the distribution of electric power in which wire harnesses are parallelized across multiple connectors provided on multiple circuit boards. Preferably, as many harnesses are provided as connectors per board. Each wire harness can distribute electric power from a plurality of voltage converters to the multiple boards in a matrix layout. Each wire harness is designed to be compact, and yet, in some embodiments, can carry more than 500 Amperes from two or more voltage converters to the multiple circuit boards. Accordingly, instead of connecting all the connectors of a single circuit board to a dedicated wire harness, each wire harness can connect to a connector on each of the multiple circuit boards. This configuration may be used to advantage to reduce the number and/or width of the wire harnesses, and to lay wire harnesses along the length of the modular cases. For example, the wire harnesses may be laid on a lattice attached to each of the modular cases. The lattice may be used to advantage to ensure a sufficient spacing between the top of the circuit boards and/or to ease the mounting of the wire harnesses the circuit boards.

Figure 10:
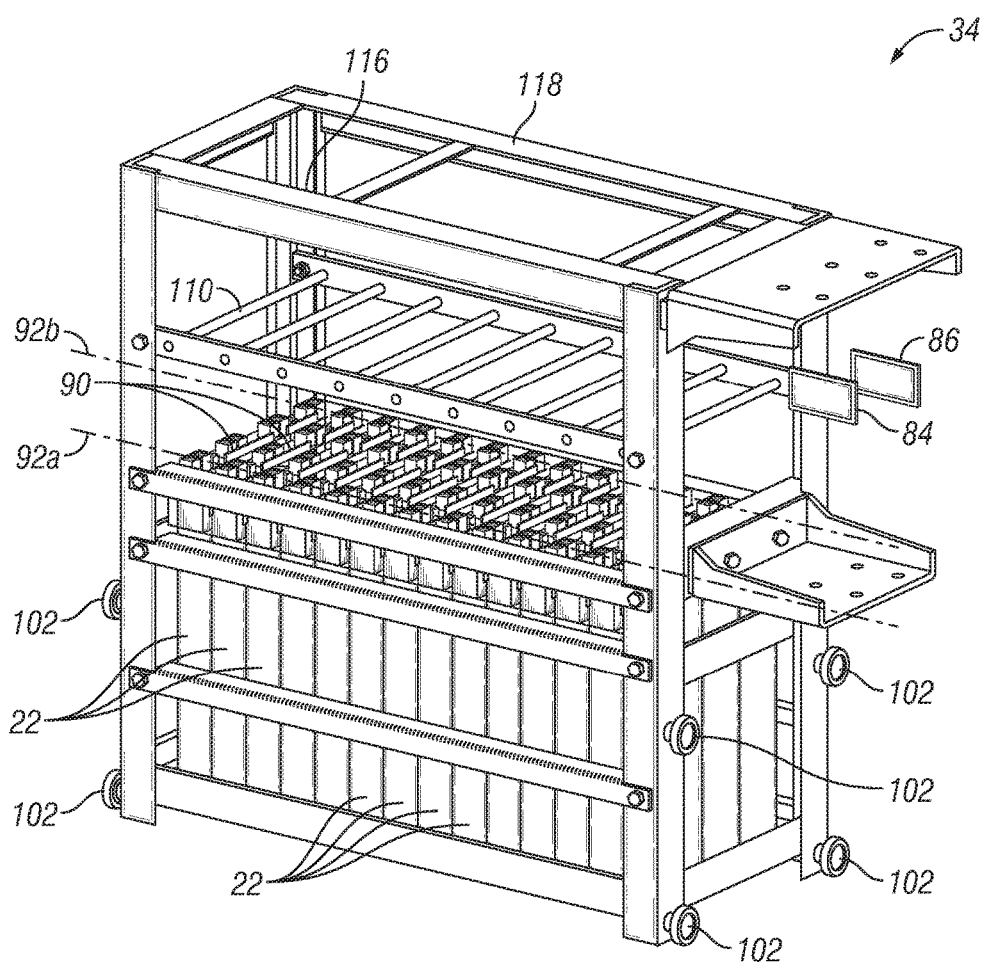
FIG. 10 is a perspective view of a modular case that may be used in the immersion tank similarly as the modular case shown in FIGS. 7A and 7B.
Figure 11:
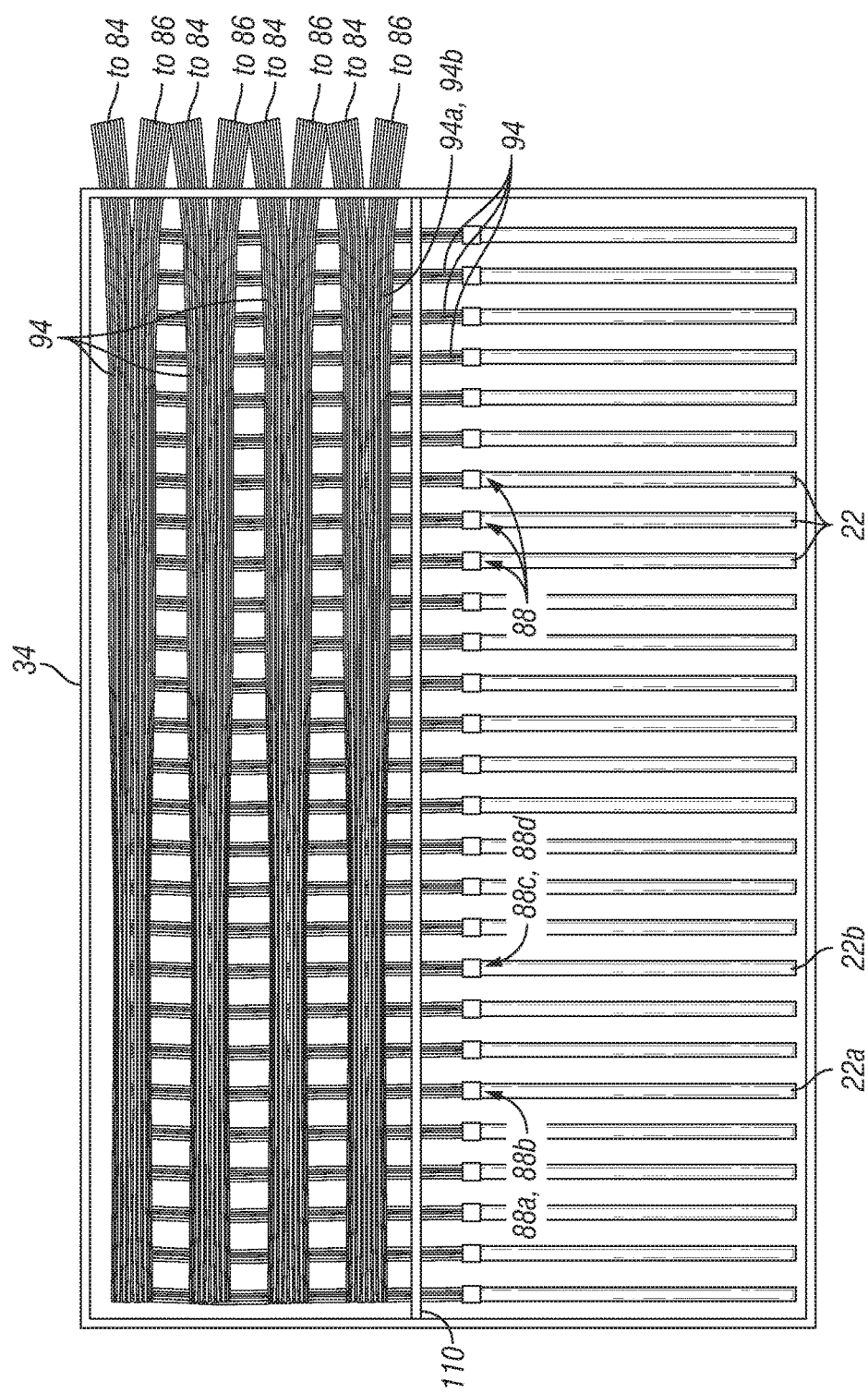
FIG. 11 is a schematic side view of wire harnesses connecting circuit boards to a pair of terminals.
Figure 12:
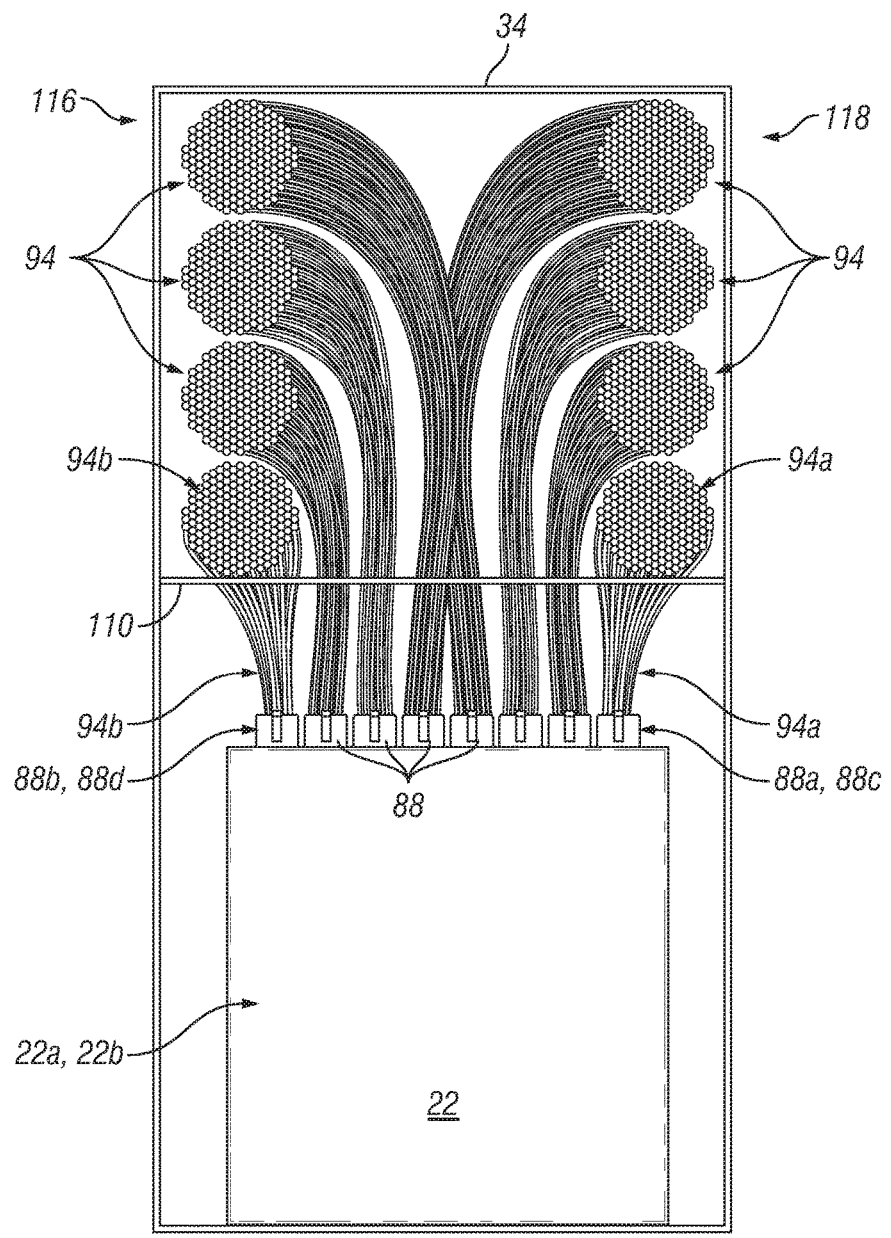
FIG. 12 is a schematic front view of the wire harnesses shown in FIG. 11.

Turning to FIG. 10, a modular case 34 that is holding circuit boards 22 vertically is illustrated. In use, the modular case 34 is lowered into the container 14 (shown in FIG. 1) for holding the bath of dielectric heat transfer fluid in liquid phase. For example, the modular case 34 includes wheels 102 configured to be guided by a set of vertical rails 54, 56 (shown in FIG. 6). The modular case 34 can hold a variable number of circuit boards 22, generally N boards, wherein N is larger or equal to two. Each circuit board 22 can have a plurality of male portions of connectors 88 attached to a top edge 90 thereof. On each circuit board 22, the male portions of each connector 88 are in positions laterally offset from the male portions of other connectors. All circuit boards 22 preferably have the same number of connectors, generally M connectors, wherein M is larger or equal to two. Each connector 88 may be attached to at least one, and preferably more than one, pair of wires that are used to provide power to electric or electronic components mounted on the circuit boards 22. The power may be provided as a low voltage (e.g., 12 volts, Direct Current), high amperage current, generated by at least one, and preferably more than one, voltage converters 18 (shown in FIG. 1).

Wire harnesses (shown in FIGS. 11, 12, 13A-13B) are designed to connect the circuit boards 22 held in the modular case 34 to a pair of terminals 84, 86. Each of the terminal 84 and/or the terminal 86 can comprise a connector plate 42 (shown in FIGS. 7A-7B, 8A-8C, or 9) secured to the modular case 34, and sockets or lugs 52 (e.g., sockets 52 as shown in FIGS. 8A-8B or 9) electrically connected to the connector plate 42. The terminal 84 is positioned laterally offset from the terminal 86. The modular case 34 preferably comprises a lattice 110 secured to the modular case 34 in a vertical position between the top of the circuit boards 22 and both of the first terminal 84 and the second terminal 86. The lattice 110 can span between a first lateral side 116 of the modular case 34 and a second lateral side 118 of the modular case 34 that is opposite of the first lateral side of the modular case 34. The wire harnesses preferably extend longitudinally along a portion of the lattice 110 in a position above the lattice 110.

Turning to FIGS. 11, 12, 13A-13B, 14 and 15, an example embodiment of wire harnesses 94 is illustrated. As best seen in the schematic illustrated in FIG. 11, the number N of circuit boards 22 may be equal to twenty-seven. As best seen in the schematic illustrated in FIG. 12, the number M of connectors 88 may be equal to eight. As best seen in the schematic illustrated in FIG. 16, each connector 88 may be attached to the end of three pairs of wires to provide power to electric or electronic components mounted on the circuit boards 22. However, other quantities of circuit boards, connectors, and pairs of wires attached to each connector may equally be used.

For the sake of simplicity, the design of two wire harnesses 94a and 94b is described with respect to two circuit boards 22a and 22b that are longitudinally offset, each including two connectors. However, a person of ordinary skill, given the benefit of this disclosure, can make and use wire harnesses for any number N of circuit boards 22 and any number M of connectors 88 by following the design of the two wire harnesses 94a and 94b. Also, the design of two wire harnesses 94a and 94b is described with respect to a first connector 88a attached to the top edge 90 of the first circuit board 22a, a second connector 88b attached to the top edge 90 of the first circuit board 22a, a third connector 88c attached to the top edge 90 of the second circuit board 22b, and a fourth connector 88d attached to the top edge 90 of the second circuit board 22b, each including only one pair of contacts. However, a person of ordinary skill, given the benefit of this disclosure, can make and use wire harnesses for connectors including any number of pairs of wires.

Accordingly, the first circuit board 22a includes the first connector 88a and the second 88b laterally offset from the first connector 88a, and the second circuit board 22b includes the third connector 88c and the fourth connector 88d laterally offset from the third connector 88c. The first connector 88a and the third connector 88c are preferably aligned along a first longitudinal line 92a (shown in FIG. 10) essentially perpendicular to the first circuit board 22a and the second circuit board 22b. Similarly, the second connector 88b and the fourth connector 88d are preferably aligned along a second longitudinal line 92b (shown in FIG. 10) essentially perpendicular to the first circuit board 22a and the second circuit board 22b.

Figure 13A:
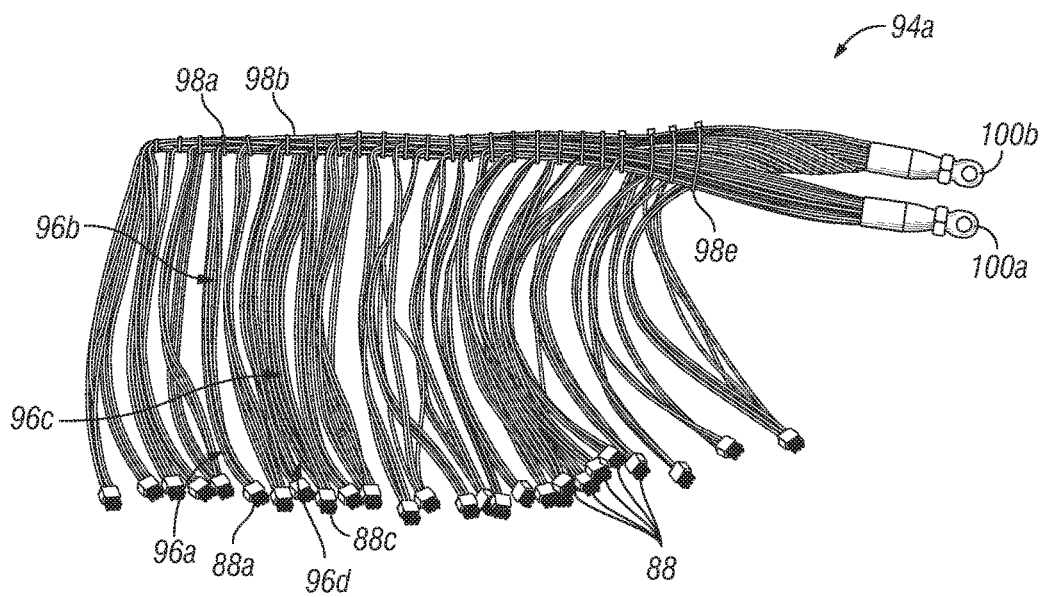
FIGS. 13A and 13B are side views of two of the wire harnesses shown in FIG. 11.

As best seen in FIG. 13A, the first wire harness 94a includes a pair of wires consisting of a first wire 96a and a second wire 96b connecting the first connector 88a to the first terminal 84 and to the second terminal 86, respectively. Similarly, the first wire harness 94a also includes a pair of wires consisting of a third wire 96c and a fourth wire 96d connecting the third connector 88c to the first terminal 84 and to the second terminal 86, respectively. Accordingly, the first wire 96a and the third wire 96c are connected to a first pin or spade 100a, which is configured to connect to the first terminal 84, and the second wire 96b and the fourth wire 96d are connected to a second pin or spade 100b, which is configured to connect to the second terminal 86. Further, each of the wires 96a, 96b, 96c, and 96d includes a horizontal portion 112 and a vertical portion 114. The female portion of the first connector 88a is attached to a lower end of the vertical portion 114 of the first wire 96a and to a lower end of the vertical portion 114 of the second wire 96b. Similarly, the female portion of third connector 88c is attached to a lower end of the vertical portion 114 of the third wire 96c and to a lower end of the vertical portion 114 of the fourth wire 96d.

Still referring to FIG. 13A, the first wire harness 94a includes a first fastening tie 98a encircling at least the first wire 96a and the second wire 96b and encircling neither the third wire 96c nor the fourth wire 96d. The first fastening tie 98a is located in the horizontal portion 112 of the first wire 96a and of the second wire 96b. The first wire harness 94a also includes a second fastening tie 98b encircling at least the first wire 96a, the second wire 96b, the third wire 96c, and the fourth wire 96d, and located in a position axially offset from the first fastening tie 98a that is closer to the first terminal 84 and the second terminal 86 than the position of the first fastening tie 98a. The second fastening tie 98b is located in the horizontal portion 112 of the first wire 96a, of the second wire 96b, of the third wire 96c, and of the fourth wire 96d.

Figure 14:
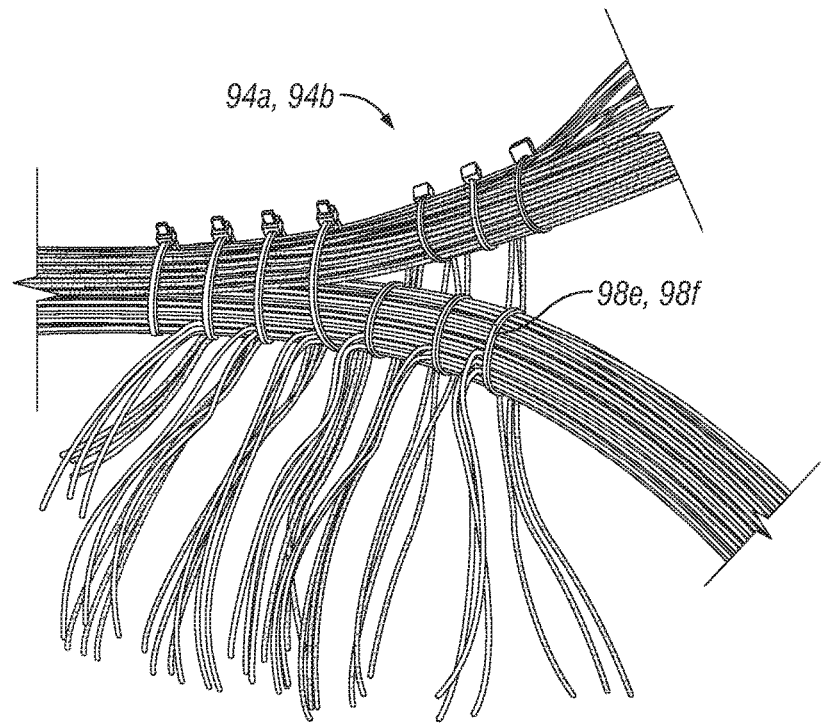
FIG. 14 a side view of a portion of the wire harnesses shown in FIG. 13A or 13B.

Referring now to FIGS. 13A and 14, the first wire harness 94a further comprises a fifth fastening tie 98e encircling at least the first wire 96a and the third wire 96c and encircling neither the second wire 96b nor the fourth wire 96d, and located in a position axially offset from the second fastening tie 98b that is closer to the first terminal 84 than the position of the second fastening tie 98b. Conversely, the first wire harness 94a further comprises another fastening tie encircling at least the second wire 96b and the fourth wire 96d and encircling neither the first wire 96a nor the third wire 96c, and located in a position axially offset from the second fastening tie 98b that is closer to the second terminal 86 than the position of the second fastening tie 98b.

Figure 13B:
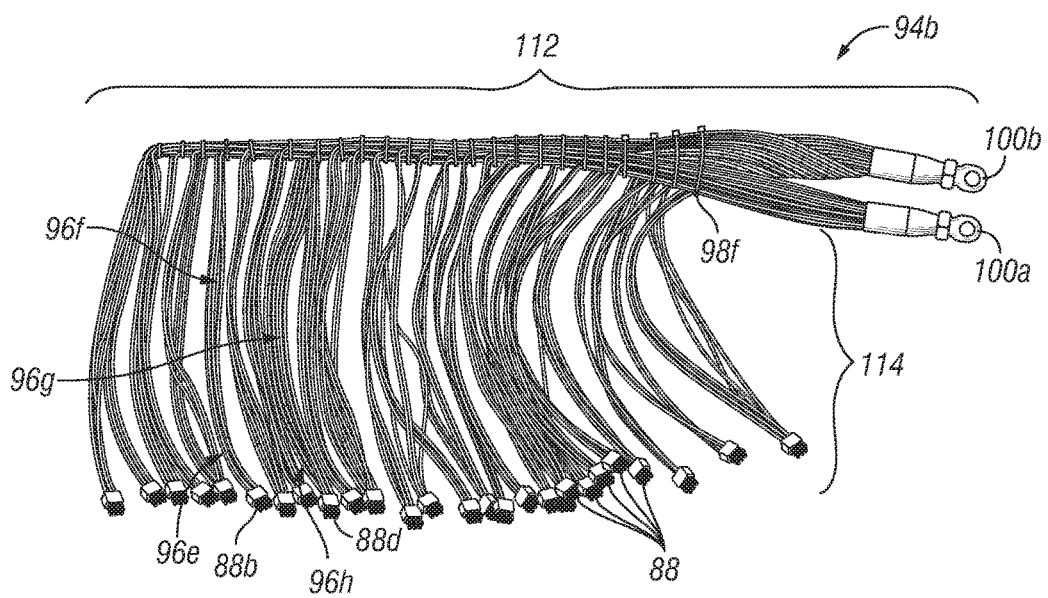

Further, as best seen in FIG. 13B, the second wire harness 94b includes a pair of wires consisting of a fifth wire 96e and a sixth wire 96f connecting the second connector 88b to the first terminal 84 and to the second terminal 86, respectively. Similarly, the second wire harness 94b also includes a pair of wires consisting of a seventh wire 96g and an eighth wire 96h connecting the fourth connector 88d to the first terminal 84 and to the second terminal 86, respectively. Accordingly, the fifth wire 96e and the seventh wire 96g are connected to a third pin or spade 100c, which is configured to connect to the first terminal 84, and the sixth wire 96f and the eighth wire 96h are connected to a fourth pin or spade 100d, which is configured to connect to the second terminal 86. Further, each of the wires 96e, 96f, the 96g, and 96h includes a horizontal portion 112 and a vertical portion 114. The female portion of the second connector 88b is attached to a lower end of the vertical portion 114 of the fifth wire 96e and to a lower end of the vertical portion 114 of the sixth wire 96f. Similarly, the female portion of fourth connector 88d is attached to a lower end of the vertical portion 114 of the seventh wire 96g and to a lower end of the vertical portion 114 of the eighth wire 96h.

Still referring to FIG. 13B, the second wire harness 94b includes a third fastening tie 98c encircling at least the fifth wire 96e and the sixth wire 96f and encircling neither the seventh wire 96g nor the eighth wire 96h. The third fastening tie 98c is located in the horizontal portion 112 of the fifth wire 96e and of the sixth wire 96f. The second wire harness 94b also includes a fourth fastening tie 98d encircling at least the fifth wire 96e, the sixth wire 96f, the seventh wire 96g, and the eighth wire 96h, and located in a position axially offset from the third fastening tie 98c that is closer to the first terminal 84 and the second terminal 86 than the position of the third fastening tie 98c. The fourth fastening tie 98d is located in the horizontal portion 112 of the fifth wire 96e, of the sixth wire 96f, of the seventh wire 96g, and of the eighth wire 96h.

Referring now to FIGS. 13B and 14, the second wire harness 94b further comprises a sixth fastening tie 98f encircling at least the fifth wire 96e and the seventh wire 96g and encircling neither the sixth wire 96f nor the eighth wire 96h, and located in a position axially offset from the fourth fastening tie 98d that is closer to the first terminal 84 than the position of the fourth fastening tie 98d. Conversely, the second wire harness 94b further comprises another fastening tie encircling at least the sixth wire 96f and the eighth wire 96h and encircling neither the fifth wire 96e nor the seventh wire 96g, and located in a position axially offset from the fourth fastening tie 98d that is closer to the second terminal 86 than the position of the fourth fastening tie 98d.

Figure 15:
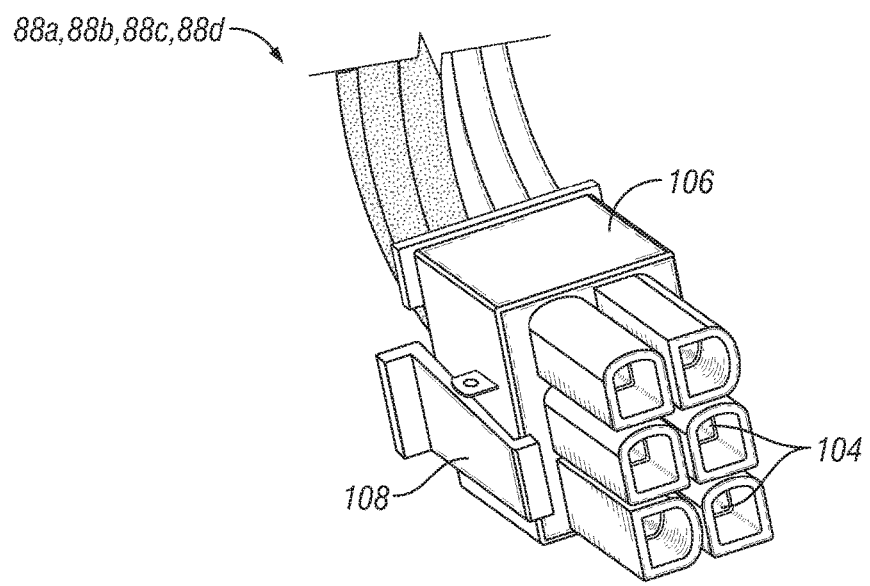
FIG. 15 is a perspective view of a female portion of the connector that is attached to the lower end of the wires of the wire harnesses shown in FIG. 13A or 13B.

Turning to FIG. 15, the connectors 88a, 88b, 88c, and/or 88d may include cylindrical spring-metal pins that fit into cylindrical spring-metal sockets. For example, the connectors 88a, 88b, 88c, and/or 88d may comprise a Tamiya connector, a JST connector, a Molex connector, a Berg connector, a mate-n-lock connector, or any equivalent thereof.

Accordingly, at least two connector pins (not shown) may be secured to the top 90 of the circuit board 22a, 22b. At least two connector sockets 104 may engage the at least two connector pins. In the first connector 88a, the first wire 96a is connected to one of the at least two connector sockets 104, and the second wire 96b is connected to the other of the at least two connector sockets 104. In the second connector 88b, the fifth wire 96e is connected to one of the at least two connector sockets 104, and the sixth wire 96f is connected to the other of the at least two connector sockets 104. In the third connector 88c, the third wire 96c is connected to one of the at least two connector sockets 104, and the fourth wire 96d is connected to the other of the at least two connector sockets 104. In the fourth connector 88d, the seventh wire 96g is connected to one of the at least two connector sockets 104, and the eighth wire 96h is connected to the other of the at least two connector sockets 104.

A first insulating shell (not shown), for example made of nylon, may form a matrix insulating each of the at least two connector pins. A second insulating shell 106, for example made of nylon, may form a matrix insulating each of the at least two connector sockets 104. The first insulating shell and the second insulating shell 106 may be keyed to ensure correct orientation upon engagement of the first insulating shell with the second insulating shell 106. For example, the first insulating shell and/or the second insulating shell 106 may have chamfered corners on one side to prevent a user from plugging it in incorrectly. Further, the second insulating shell 106 may include a latch 108 to lock into position the first insulating shell with the second insulating shell 106 upon engagement of the first insulating shell with the second insulating shell 106.

Figure 16:
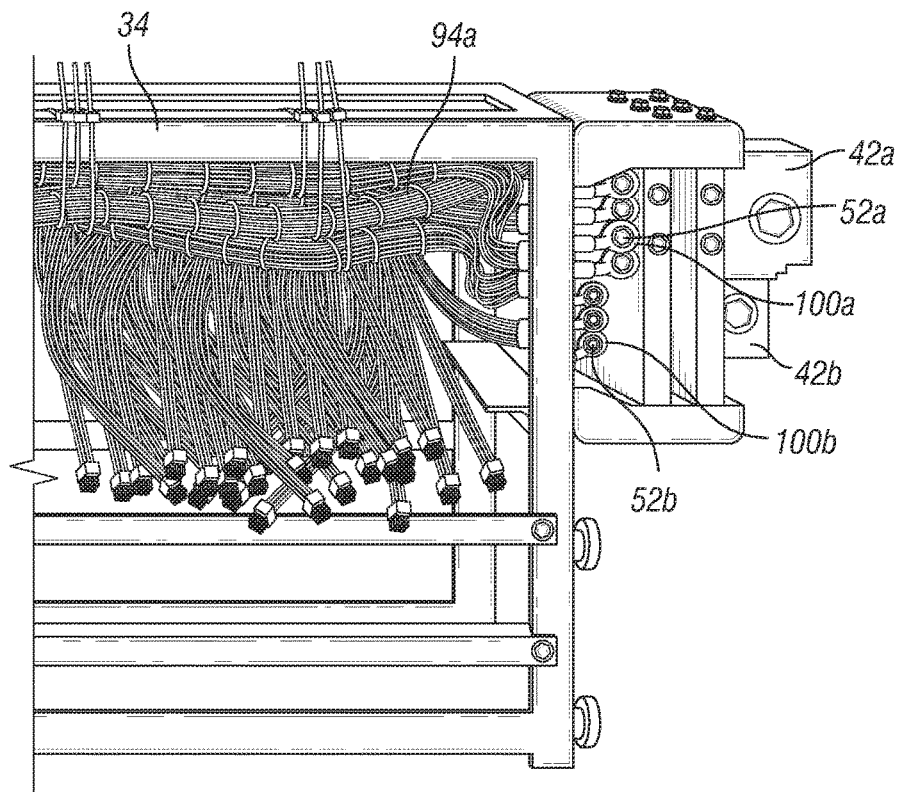
FIG. 16 is a side view of a portion of a modular case equipped with wire harnesses such as shown in FIG. 13A or 13B.

Turning to FIG. 16, the first terminal 84 optionally comprises a first connector plate 42a secured to the modular case 34. A first socket or lug 52a is electrically connected to the first connector plate 42a. The first pin or spade 100a is configured to connect to the first socket or lug 52a. Thus, the first wire 96a (shown in FIG. 13A), and the third wire 96c (shown in FIG. 13A) of the first wire harness 94a are connected to the first connector plate 42a via the first pin or spade 100a. Also, the second terminal 86 optionally comprises a second connector plate 42b secured to the modular case 34. A second socket or lug 52b is electrically connected to the second connector plate 42b. The second pin or spade 100b is configured to connect to the second socket or lug 52b. Thus, the second wire 96b (shown in FIG. 13A), and the fourth wire 96d (shown in FIG. 13A) of the first wire harness 94a are connected to the second connector plate 42b via the first pin or spade 100b.

Similarly, a third socket or lug (not shown) may be electrically connected to the first connector plate 42a. The third pin or spade 100c (shown in FIG. 13B) may be configured to connect to the third socket or lug. Thus, the fifth wire 96e (shown in FIG. 13B), and the seventh wire 96g (shown in FIG. 13B) of the second wire harness 94b may be connected to the first connector plate 42a via the third pin or spade 100c. Also, a fourth socket or lug (not shown) may be electrically connected to the second connector plate 42b. The fourth pin or spade 100d (shown in FIG. 13B) may be configured to connect to the fourth socket or lug. Thus, the sixth wire 96f (shown in FIG. 13B), and the eighth wire 96h (shown in FIG. 13B) of the second wire harness 94b may be connected to the second connector plate 42b via the fourth pin or spade 100d.

Figure 17:
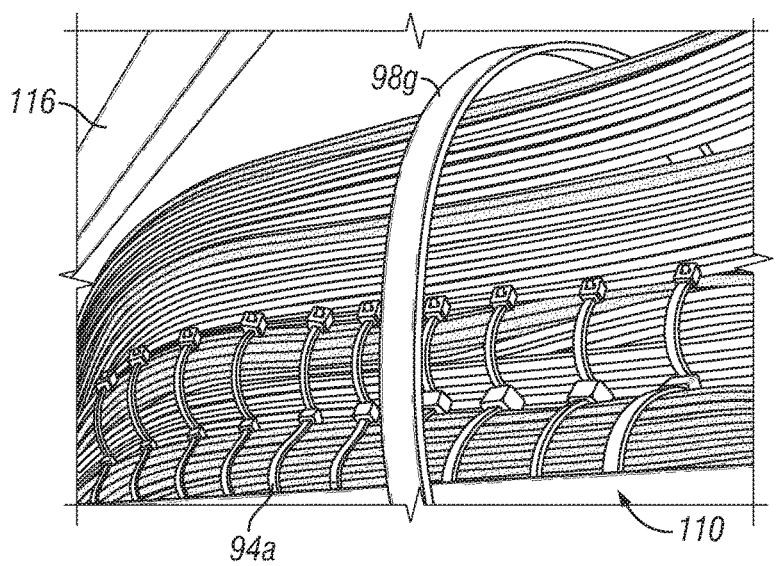
FIG. 17 is a perspective view of a side portion of the modular case shown in FIG. 16.

Turning to FIG. 17, the modular case 34 may optionally comprise a seventh fastening tie 98g that is encircling at least a portion of the first wire harness 94a, and that attaches the first wire harness 94a to a first lateral side 116 of the modular case 34, and/or to the lattice 110.

Similarly an eighth fastening tie (not shown) may be encircling at least a portion of the second wire harness 94b (shown in FIG. 13B) and may attach the second wire harness 94b to a second lateral side 118 (shown in FIG. 10) of the modular case 34, and/or to the lattice 110.

While the disclosure is susceptible to various modifications and alternative forms, specific embodiments thereof are shown by way of example in the drawings and description. It should be understood, however, that the drawings and detailed description thereto are not intended to limit the claims to the particular form disclosed, but on the contrary, the intention is to cover all modifications, equivalents, and alternatives falling within the scope of the claims.

What is claimed is:

1. A modular case for holding circuit boards, comprising:
a first terminal secured to the modular case;
a second terminal secured to the modular case in a position laterally offset from the first terminal;
a first circuit board held vertically in the modular case, the first circuit board including at least a first connector attached to a top edge of the first circuit board and a second connector attached to the top edge of the first circuit board in a position laterally offset from the first connector;
a second circuit board held vertically in the modular case in a position longitudinally offset from the first circuit board and closer to the first terminal and the second terminal than a position of the first circuit board, the second circuit board including at least a third connector attached to a top edge of the second circuit board and a fourth connector attached to the top edge of the second circuit board in a position laterally offset from the third connector;
wherein the first connector and the third connector are aligned along a first longitudinal line essentially perpendicular to the first circuit board and the second circuit board, and wherein the second connector and the fourth connector are aligned along a second longitudinal line essentially perpendicular to the first circuit board and the second circuit board;
a first wire harness including:
a first wire connecting the first connector to the first terminal;
a second wire connecting the first connector to the second terminal;
a third wire connecting the third connector to the first terminal;
a fourth wire connecting the third connector to the second terminal;
a first fastening tie encircling at least the first wire and the second wire and encircling neither the third wire nor the fourth wire; and
a second fastening tie encircling at least the first wire, the second wire, the third wire, and the fourth wire, and located in a position axially offset from the first fastening tie that is closer to the first terminal and the second terminal than a position of the first fastening tie; and
a second wire harness including:
a fifth wire connecting the second connector to the first terminal;
a sixth wire connecting the second connector to the second terminal;
a seventh wire connecting the fourth connector to the first terminal;
an eighth wire connecting the fourth connector to the second terminal;
a third fastening tie encircling at least the fifth wire and the sixth wire and encircling neither the seventh wire nor the eighth wire; and
a fourth fastening tie encircling at least the fifth wire, the sixth wire, the seventh wire, and the eighth wire, and located in a position axially offset from the third fastening tie that is closer to the first terminal and the second terminal than a position of the third fastening tie.

2. The modular case of claim 1, wherein the first terminal comprises:
a first connector plate secured to the modular case; and
at least a first socket or lug electrically connected to the first connector plate,
wherein the first wire and the third wire are connected to a first pin or spade configured to connect to the first socket or lug.

3. The modular case of claim 2, wherein the second terminal comprises:
a second connector plate secured to the modular case in a position laterally offset from the first connector plate; and
at least a second socket or lug electrically connected to the second connector plate,
wherein the second wire and the fourth wire are connected to a second pin or spade configured to connect to the second socket or lug.

4. The modular case of claim 1, including wheels configured to be guided by a set of rails.

5. The modular case of claim 1, wherein the first connector comprises:
   at least two pins secured to the top of the first circuit board;
   a first insulating shell forming a matrix insulating each of the at least two pins;
   at least two sockets engaging the at least two pins; and
   a second insulating shell forming a matrix insulating each of the at least two sockets,
   wherein the first wire is connected to one of the at least two sockets, and wherein the second wire is connected to the other of the at least two sockets.

6. The modular case of claim 5, wherein the first insulating shell of the first connector and the second insulating shell of the first connector are keyed to ensure correct orientation upon engagement of the first insulating shell of the first connector with the second insulating shell of the first connector, and wherein the second insulating shell of the first connector includes a latch to lock into position the first insulating shell of the first connector with the second insulating shell of the first connector upon engagement of the first insulating shell of the first connector with the second insulating shell of the first connector.

7. The modular case of claim 5, wherein the third connector comprises:
   at least two pins secured to the top of the second circuit board;
   a first insulating shell forming a matrix insulating each of the at least two pins;
   at least two sockets engaging the at least two pins; and
   a second insulating shell forming a matrix insulating each of the at least two sockets,
   wherein the third wire is connected to one of the at least two sockets, and wherein the fourth wire is connected to the other of the at least two sockets.

8. The modular case of claim 7, wherein the first insulating shell of the third connector and the second insulating shell of the third connector are keyed to ensure correct orientation upon engagement of the first insulating shell of the third connector with the second insulating shell of the third connector, and wherein the second insulating shell of the third connector includes a latch to lock into position the first insulating shell of the third connector with the second insulating shell of the third connector upon engagement of the first insulating shell of the third connector with the second insulating shell of the third connector.

9. The modular case of claim 7, wherein the second connector comprises:
   at least two pins secured to the top of the first circuit board;
   a first insulating shell forming a matrix insulating each of the at least two pins;
   at least two sockets engaging the at least two pins; and
   a second insulating shell forming a matrix insulating each of the at least two sockets,
   wherein the fifth wire is connected to one of the at least two sockets, and wherein the sixth wire is connected to the other of the at least two sockets.

10. The modular case of claim 9, wherein the first insulating shell of the second connector and the second insulating shell of the second connector are keyed to ensure correct orientation upon engagement of the first insulating shell of the second connector with the second insulating shell of the second connector, and wherein the second insulating shell of the second connector includes a latch to lock into position the first insulating shell of the second connector with the second insulating shell of the second connector upon engagement of the first insulating shell of the second connector with the second insulating shell of the second connector.

11. The modular case of claim 9, wherein the fourth connector comprises:
   at least two pins secured to the top of the first circuit board;
   a first insulating shell forming a matrix insulating each of the at least two pins;
   at least two sockets engaging the at least two pins; and
   a second insulating shell forming a matrix insulating each of the at least two sockets,
   wherein the seventh wire is connected to one of the at least two sockets, and wherein the eighth wire is connected to the other of the at least two sockets.

12. The modular case of claim 11, wherein the first insulating shell of the fourth connector and the second insulating shell of the fourth connector are keyed to ensure correct orientation upon engagement of the first insulating shell of the fourth connector with the second insulating shell of the fourth connector, and wherein the second insulating shell of the fourth connector includes a latch to lock into position the first insulating shell of the fourth connector with the second insulating shell of the fourth connector upon engagement of the first insulating shell of the fourth connector with the second insulating shell of the fourth connector.

13. The modular case of claim 1, further comprising:
   a fifth fastening tie encircling at least a portion of the first wire harness and attaching the first wire harness to a first lateral side of the modular case; and
   a sixth fastening tie encircling at least a portion of the second wire harness and attaching the second wire harness to a second lateral side of the modular case opposite of the first lateral side of the modular case.

14. The modular case of claim 1, further comprising a lattice connected to the modular case in a vertical position between the top of the first circuit board and both of the first terminal and the second terminal, and between the top of the second circuit board and both of the first terminal and the second terminal, and wherein the first wire harness and the second wire harness extend longitudinally along a portion of the lattice in a position above the lattice.

15. The modular case of claim 14, wherein the lattice spans between t a first lateral side of the modular case and a second lateral side of the modular case opposite of the first lateral side of the modular case.

16. The modular case of claim 1, wherein:
   the first wire harness further comprises a fifth fastening tie encircling at least the first wire and the third wire and encircling neither the second wire nor the fourth wire, and located in a position axially offset from the second fastening tie that is closer to the first terminal or the second terminal than the position of the second fastening tie, and
   the second wire harness further comprises a sixth fastening tie encircling at least the fifth wire and the seventh wire and encircling neither the sixth wire nor the eighth wire, and located in a position axially offset from the fourth fastening tie that is closer to the first terminal or the second terminal than the position of the fourth fastening tie.

17. The modular case of claim 1, wherein each of the first wire, the second wire, the third wire, the fourth wire, the fifth wire, the sixth wire, the seventh wire, the eighth wire include a horizontal portion and a vertical portion.

18. The modular case of claim 17, wherein:

the first fastening tie is located in the horizontal portion of the first wire and of the second wire;

the second fastening tie is located in the horizontal portion of the first wire, of the second wire, of the third wire, and of the fourth wire;

the third fastening tie is located in the horizontal portion of the fifth wire and of the sixth wire; and the fourth fastening tie is located in the horizontal portion of the fifth wire, of the sixth wire, of the seventh wire, and of the eighth wire.

19. The modular case of claim 17, wherein:

the first connector is attached to a lower end of the vertical portion of the first wire and to a lower end of the vertical portion of the second wire;

the second connector is attached to a lower end of the vertical portion of the fifth wire and to a lower end of the vertical portion of the sixth wire;

the third connector is attached to a lower end of the vertical portion of the third wire and to a lower end of the vertical portion of the fourth wire; and the fourth connector is attached to a lower end of the vertical portion of the seventh wire and to a lower end of the vertical portion of the eighth wire.

20. A two-phase immersion cooling system, comprising:

the modular case of claim 1, wherein the first terminal is electrically connected in parallel to negative terminals of a plurality of voltage converters, and wherein the second terminal is electrically connected in parallel to positive terminals of the plurality of voltage converters.

21. A two-phase immersion cooling system, comprising:

a skid;

an immersion tank mounted on the skid and including a container for holding a bath of dielectric heat transfer fluid in liquid phase and at least one condenser for condensing dielectric heat transfer fluid from a vapor phase to a liquid phase; a plurality of voltage converters mounted on the skid outside the immersion tank, each voltage converter being designed for converting a high voltage, low amperage current into a low voltage, high amperage current; two busbars, each busbar extending through a wall of the immersion tank, each busbar including an inner portion extending inside the immersion tank and an outer portion extending outside the immersion tank, wherein a first one of the two busbars is electrically connected to a positive terminal of each of the plurality of voltage converters, and wherein a second one of the two busbars is electrically connected to a negative terminal of each of the plurality of voltage converters; and a modular case configured for holding a plurality of circuit boards, wherein the modular case is sized to be at least partially lowered into the container for holding the bath of dielectric heat transfer fluid in liquid phase, wherein each of the plurality of circuit boards is connected to the two busbars via connector plates and wire harnesses that are secured to the modular case.

* * * * *